(12) United States Patent
Ueda et al.

(10) Patent No.: US 7,283,391 B2
(45) Date of Patent: Oct. 16, 2007

(54) SEMICONDUCTOR MEMORY DEVICE

(75) Inventors: Naoki Ueda, Nara (JP); Nobuhiko Ito, Tenri (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/934,212

(22) Filed: Sep. 3, 2004

(65) Prior Publication Data
US 2005/0057993 A1    Mar. 17, 2005

(30) Foreign Application Priority Data
Sep. 3, 2003    (JP) ............................. 2003-311865

(51) Int. Cl.
*G11C 16/04* (2006.01)
*G11C 5/14* (2006.01)
*G11C 7/00* (2006.01)

(52) U.S. Cl. ............................ 365/185.15; 365/185.02; 365/185.05; 365/185.18; 365/189.09; 365/189.11

(58) Field of Classification Search ............ 365/185.2, 365/185.5, 185.18, 189.09, 189.11
See application file for complete search history.

(56) References Cited

U.S. PATENT DOCUMENTS

| | | | | |
|---|---|---|---|---|
| 5,258,635 A | * | 11/1993 | Nitayama et al. ............ 257/329 |
| 5,679,591 A | * | 10/1997 | Lin et al. ..................... 438/257 |
| 5,703,815 A | * | 12/1997 | Kuhara et al. ............... 365/194 |
| 5,798,966 A | * | 8/1998 | Keeney ................... 365/185.18 |
| 5,812,440 A | * | 9/1998 | Suminaga et al. ............. 365/51 |
| 6,532,174 B2 | * | 3/2003 | Homma et al. ........... 365/185.2 |
| 6,594,176 B2 | * | 7/2003 | Lammers ..................... 365/171 |
| 6,831,316 B1 | * | 12/2004 | Matsuoka et al. ........... 257/296 |
| 6,867,998 B2 | * | 3/2005 | Kang .......................... 365/145 |
| 2002/0008992 A1 | * | 1/2002 | Tanaka et al. ......... 365/185.13 |
| 2002/0048204 A1 | * | 4/2002 | Kuroda et al. ............... 365/200 |
| 2003/0218908 A1 | * | 11/2003 | Park et al. ............. 365/185.16 |
| 2004/0095805 A1 | * | 5/2004 | Matsuoka ................. 365/185.2 |
| 2004/0228163 A1 | * | 11/2004 | Khouri et al. ............... 365/154 |
| 2005/0024916 A1 | * | 2/2005 | Kang .......................... 365/145 |

FOREIGN PATENT DOCUMENTS

| | | | |
|---|---|---|---|
| JP | 04246855 A | * | 9/1992 |
| JP | 08153391 A | * | 6/1996 |
| JP | 08221990 A | * | 8/1996 |
| JP | 08263985 A | * | 10/1996 |

\* cited by examiner

*Primary Examiner*—Ly Duy Pham
(74) *Attorney, Agent, or Firm*—Morrison & Foerster LLP

(57) ABSTRACT

A semiconductor memory device comprises: a plurality of memory elements; at least one bit line, wherein a memory operation is performed via at least a portion of the bit line with respect to at least one of the plurality of memory elements; and a load resistance regulating circuit for changing a resistance value to reduce or eliminate a difference in bit line load resistance depending on a position of the memory element.

23 Claims, 3 Drawing Sheets

Conventional Art

SEMICONDUCTOR MEMORY DEVICE

This non-provisional application claims priority under 35 U.S.C. §119(a) on Patent Application No. 2003-311865 filed in Japan on Sep. 3, 2003, the entire contents of which are hereby incorporated by reference.

BACKGROUND OF THE INVENTION

1. Field of the Invention

The present invention relates to a semiconductor memory device capable of regulating a difference in bit line load resistance caused depending on the position of a memory element. The semiconductor memory device is used as a non-volatile semiconductor memory device, such as writable EEPROM or EPROM, or the like.

2. Description of the Related Art

Japanese Laid-Open Publication No. 5-198775 discloses a semiconductor memory device capable of regulating a difference in the load resistance of a bit line (hereinafter also simply referred to as bit line load resistance), which is caused depending on the position of a memory element. This device will be described below with reference to FIG. 3.

FIG. 3 is an equivalent circuit diagram showing a memory array structure of a conventional semiconductor memory device.

In FIG. 3, a memory array of the semiconductor memory device comprises: a plurality of virtual ground lines SG (SG1 to SGn, . . . ) arranged in parallel; a plurality of sub-bit lines SB (SB1 to SBn, . . . ) each provided between adjacent virtual ground lines SG; main-bit lines MB (MB1, . . . ) connected to respective groups of sub-bit lines, main ground lines MG (MG1 to MGn, . . . ) each connected to a plurality of virtual ground lines SG; a plurality of word select lines WL (WL0 to WLm, . . . ) provided along a direction crossing the sub-bit line; a plurality of memory cells MC ($MC_{1,1}$ to $MC_{m,n}$, . . . ) each provided between a virtual ground line SG and a sub-bit line SB; and switching elements ST (ST1 to STn, . . . ) provided between the main-bit line MB and the sub-bit line SB in the respective bit line groups.

The memory cell MC comprises a MOS transistor, in which the virtual ground line SG is connected to the source terminal, the sub-bit line SB is connected to the drain terminal, and the word select line WL is connected to the gate terminal. Note that the main ground line MG overlaps the memory cell MC in FIG. 3, but the main ground line MG is not connected to the memory cell MC.

The gate terminals of the switching elements ST are connected to respective select signal lines SGT (SGT1 to SGTn, . . . ).

In this memory array, the main-bit line MB and the main ground line MG are made of a metal conductor. The resistance of a conductor is negligible. The sub-bit line SB and the virtual ground line SG have an impurity diffusion region having a higher resistance than that of a metal conductor. Note that the virtual ground line may also be referred to as a sub-bit line, and therefore, will be described below as a source-side sub-bit line SG.

In the memory array of FIG. 3, the total length of the impurity diffusion regions of the drain-side sub-bit line SB and the source-side sub-bit line SG, of a selected memory cell MC, is set to be constant so as to reduce variations in driving current due to the dependency of the driving current on the total conductor resistance.

For example, in FIG. 3, a memory cell positioned on column n selected by the drain-side sub-bit line SBn and the source-side sub-bit line SGn and row m selected by an m-th word line WLm is referred to as $MC_{m,n}$. In this case, the conductor resistance of the drain-side sub-bit line SBn of the memory cell $MC_{m,n}$ is m×r where r is a resistance per unit cell. On the other hand, the conductor resistance of the source-side sub-bit line SGn is (s−m)×r where s is a distance to a contact C of a sub-bit line (unit: bit). In this case, the total of the resistance of sub-bit lines (the sum of the drain-side and source-side conductor resistances: s×r) is constant.

A memory cell $MC_{m+k,n}$ is located on the same column as that of the memory cell $MC_{m,n}$ (column n) and away by k on a row from the memory cell $MC_{m,n}$. Between the memory cell $MC_{m+k,n}$ and the memory cell $MC_{m,n}$, the conductor resistance of the drain-side sub-bit line SBm+k and the conductor resistance of the source-side sub-bit line SGm+k are (m+k)×r and (s−m−k)×r, respectively. Therefore, the sum of these sub-bit line resistances is s×r.

Therefore, according to the above-described conventional technique (Japanese Laid-Open Publication No. 5-198775), even if the position of a memory cell is changed on the same row (position in a row direction), the sum of sub-bit line resistances (s×r) can be constant.

In the above-described conventional technique (Japanese Laid-Open Publication No. 5-198775), the sum of sub-bit line resistances can be a constant value (s×r) in the driving current path of selected memory cells MC. However, the conventional technique has the following problems (1) and (2).

(1) The conductor resistance of the source-side sub-bit lines SG is m×r (m is the row position of a memory cell MC from a contact C of a main ground line MG and a sub-bit line SG), which depends on the position of a memory cell $MC_{m,n}$. Therefore, when the selected memory cell is driven, the source-substrate potential difference is changed from 0 to m×r (m=0, 1, . . . ). Therefore, the substrate bias effect of the memory cell $MC_{m,n}$ (MOSFET) is changed by a factor of up to m, depending on the address (position) of the memory cell $MC_{m,n}$.

(2) As the volume of a memory is increased and the width of a conductor is reduced with an improvement in miniaturization and production techniques, variations in resistance due to a difference in position from the main-bit line MB to the sub-bit line SB (position in a lateral direction in FIG. 3) cannot be ignored even when the main-bit line MB is made of a metal conductor. Thus, the resistance cannot be maintained constant.

The above-described problems (1) and (2) lead to the following problems when the memory cell $MC_{m,n}$ is driven.

(1) When the memory cell $MC_{m,n}$ is made of MOSFET, variations in source-substrate potential difference cause the substrate bias effect corresponding to the above-described resistance difference (m−1)×r. As a result, a driving current is reduced. Therefore, particularly in EEPROM or EPROM in which the injection of hot electrons causes data writing, the injection characteristics of hot electrons is deteriorated, so that a program speed varies.

(2) Variations in resistance depending on the path from a main-bit line MB to a sub-bit line SB change a conductor resistance on a driving current path to lead to variations in read or write operations of the memory cell $MC_{m,n}$ depending on the address (position).

SUMMARY OF THE INVENTION

According to one aspect of this invention, there is provided a semiconductor memory device, comprising: a plurality of memory elements; at least one bit line, wherein a memory operation is performed via at least a portion of the bit line with respect to at least one of the plurality of memory elements; and a load resistance regulating circuit for changing a resistance value to reduce or eliminate a difference in bit line load resistance depending on a position of the memory element.

In one embodiment of the present invention, a semiconductor memory device further comprises: at least one word line, wherein the bit lines are arranged in parallel to one another, the word lines are arranged in parallel to one another, and the bit lines cross the word lines, and each of the plurality of memory elements has two driving terminals connected to corresponding bit lines adjacently located, and a control terminal connected to a corresponding word line.

In one embodiment of the present invention, each of the bit lines may has a first bit line made of an impurity diffusion region, a second bit line made of a metal conductor connected to the first bit line, and a third bit line made of a metal conductor connected to an end of the second bit line via a bit line selecting element, and a voltage is supplied to one of the memory elements via the third bit line, the second bit line, and the first bit line.

In one embodiment of the present invention, the second bit line comprises a plurality of branched lines connected to the third bit-line.

In one embodiment of the present invention, the load resistance regulating circuit is provided on a voltage supplying path between an end of the bit line and an output end of a voltage supplying circuit for supplying a predetermined voltage to the bit line.

In one embodiment of the present invention, the load resistance regulating circuit changes a resistance value based on address information to reduce or eliminate a difference in a load resistance of a bit line in a row direction.

In one embodiment of the present invention, the load resistance regulating circuit is a load resistance switching circuit having a plurality of resistance elements and a resistance element selecting means for selecting at least one of the plurality of resistance elements.

In one embodiment of the present invention, the resistance element selecting means switches the resistance elements based on the address information of the memory element.

In one embodiment of the present invention, the load resistance regulating circuit has a variable resistance element and a resistance value controlling means for controlling the variable resistance element to change the resistance value thereof.

In one embodiment of the present invention, the resistance value controlling means changes the resistance value of the variable resistance element based on the address information of the memory element.

In one embodiment of the present invention, a major portion of the resistance element has the same structure as that of the bit line and the major portion and the bit line are produced by the same production step.

In one embodiment of the present invention, a major portion of the resistance element is produced using the same design protocol as that of at least a portion of the bit line.

In one embodiment of the present invention, the load resistance regulating circuit controls a driving ability of the bit line selecting element to change a resistance value of the bit line selecting element to reduce or eliminate a difference in a load resistance of the bit line.

In one embodiment of the present invention, the load resistance regulating circuit changes and outputs a control voltage of the bit line selecting element based on the address information of the memory element.

In one embodiment of the present invention, the load resistance regulating circuit determines the resistance value so that a sum of load resistances between a driving terminal of the selected memory element and an output end of a voltage supplying circuit for supplying a voltage to the bit line is constant or within a predetermined range, irrespective of a position of the selected memory element.

In one embodiment of the present invention, a first conductor length, from one driving terminal of the memory element to a voltage supplying circuit for supplying a voltage to the bit line, is equal to a second conductor length, from the other driving terminal of the memory element to the voltage supplying circuit, or a difference between the first and second conductor length is within a predetermined range.

In one embodiment of the present invention, the semiconductor memory device has a contactless structure, in which two driving terminals of the memory element are made of an impurity diffusion region, a contact portion with respect to a metal conductor is not provided for each memory element, but a contact portion with respect to a metal conductor is provided for a plurality of memory elements.

In one embodiment of the present invention, the memory element is a MOS transistor.

In one embodiment of the present invention, the memory element utilizes a channel hot electron injection phenomenon to do memory operations, such as an information read operation, an information write operation, or an information erase operation.

Functions of the present invention will be described below.

The present invention provides a semiconductor memory device comprising memory elements (memory cells (e.g., MOSFET, etc.)) having driving terminals (i.e., a source terminal and a drain terminal) connected to a first bit line (sub-bit line) made of, for example, an impurity diffusion region. The first bit line is connected to a voltage supplying circuit via a second bit line (sub-bit line) made of a metal conductor, a bit line selecting element, and a third bit line (main-bit line) made of a metal conductor. The semiconductor memory device is provided with a load resistance regulating circuit for regulating a difference in bit line load resistance depending on the position (address) of a memory cell to reduce or eliminate the difference.

As the load resistance regulating circuit, for example, a load resistance switching circuit is provided between a memory cell and a voltage supplying circuit for supplying a voltage to a bit line. In this case, the load resistance switching circuit comprises a plurality of load resistance elements and a load resistance element selecting means (e.g., a multiplexer, etc.), for selecting a load resistance element based on information about the address position of the selected memory cell so that a different load resistance is provided depending on the position (address) of a memory cell on a bit line.

A major portion of the load resistance element of the load resistance switching circuit preferably has the same structure as that of at least a portion of a bit line, and is preferably produced by the same production step. In addition, a major portion of the load resistance element of the load resistance switching circuit is preferably produced by the same design protocol as that of at least a portion of a bit line.

The load resistance regulating circuit regulates (variable control) the driving ability of the bit line selecting element made of a transistor or the like by controlling a gate voltage, so that a difference in bit line load resistance depending on the position (address) of a memory cell can be reduced or eliminated.

Thereby, it is possible to regulate a sum of load resistances between a driving terminal (a source terminal and a drain terminal) of the selected memory element, and an output end of the voltage supplying circuit for supplying a voltage to the bit line, to be constant or within a predetermined range, irrespective of the position of the selected memory cell.

When a conductor length from the drain terminal of a memory cell to the voltage supplying circuit is substantially equal to a conductor length from the source terminal of the memory cell and the voltage supplying circuit, the load resistance of the source-side bit line is substantially equal to the load resistance of the drain-side bit line.

Thereby, the load resistance of the drain-side bit line and the load resistance of the source-side bit line of a memory cell viewed from a voltage supplying circuit are equal to each other, so that the bit line load resistance independent of the row address of the selected memory cell can be provided. Therefore, as is different from conventional techniques, (1) a driving current does not vary due to a substrate bias effect between the source terminal of a selected memory cell and a voltage supplying circuit; and (2) a load resistance does not vary on a main-bit line irrespective of the position of a sub-bit line. Therefore, a voltage drop (potential difference), between the source terminal or the drain terminal of a selected memory cell and the voltage supplying circuit, due to a driving current and a bit line load resistance becomes equal to each other. As a result, a drain voltage and a source voltage can be constant at an arbitrary address within a chip during a read operation, a write operation, and an erase operation.

The present invention is particularly effective for non-volatile memory cells which utilize the channel hot electron injection phenomenon to do a write or read operation with respect to a memory element. The present invention is also effective for a contactless structure in which a contact with respect to a metal conductor is not provided for each memory cell.

As described above, according to the present invention, the load resistance of the drain-side bit line and the load resistance of the source-side bit line of a memory cell viewed from a voltage supplying circuit are equal to each other, so that the bit line load resistance independent of the row address of the selected memory cell can be provided. Therefore, a voltage drop (potential difference) between the source terminal or the drain terminal of a selected memory cell and the voltage supplying circuit due to a driving current and a bit line load resistance becomes equal to each other. Therefore, it is possible to reduce a variation in a drain voltage and a source voltage during a read operation and a write/erase operation caused by injection of hot carriers, thereby reducing a variation in performance due to the substrate bias effect. Thus, it is possible to accurately read information stored in a memory cell. Further, a variation in a threshold voltage during writing of information and after writing is reduced, resulting in an improvement of write precision.

Thus, the invention described herein makes possible the advantages of providing a semiconductor memory device, in which the source-side and drain-side bit line load resistances of a memory cell transistor can be regulated so that a difference in bit line load resistance depending on the position of a memory element can be reduced or eliminated, and a variation in resistance value from a main-bit line to a sub-bit line depending on the position of a sub-bit line can be reduced or eliminated.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

In Embodiments 1 and 2 of the present invention, a non-volatile semiconductor memory device is provided, which comprises memory cells made of a MOSFET, and in which the channel hot electron injection phenomenon is used to do a write or read operation with respect to each memory cell.

Embodiment 1

Figure 1:
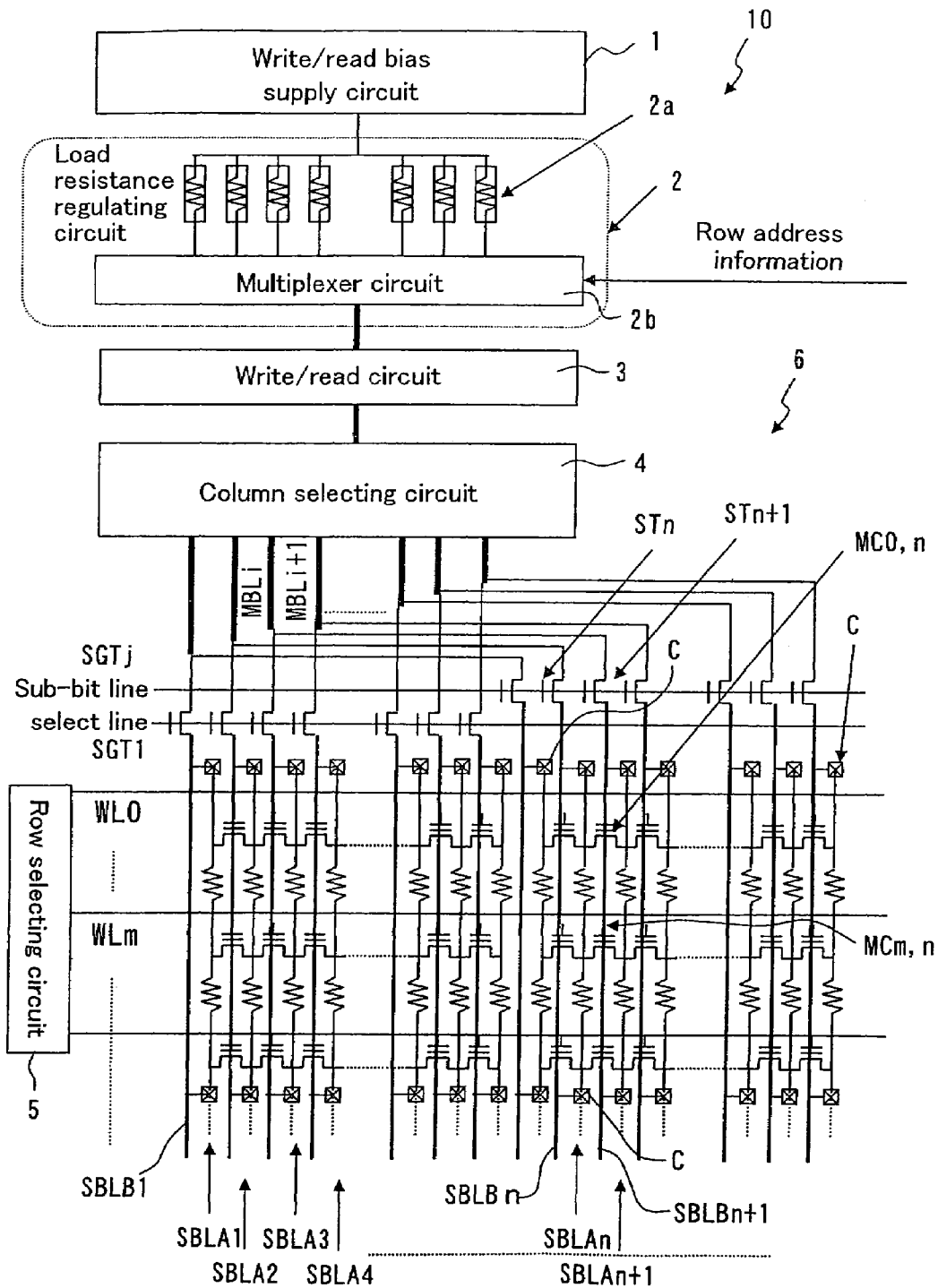
FIG. 1 is a diagram showing an equivalent circuit configuration of a memory array and its peripheral control circuit in a semiconductor memory device according to Embodiment 1 of the present invention.

FIG. 1 is a diagram showing an equivalent circuit configuration of a memory array and its peripheral control circuit in a semiconductor memory device according to Embodiment 1 of the present invention.

Referring to FIG. 1, a semiconductor memory device 10 comprises a control circuit and a memory array 6. The control circuit comprises: a write/read bias supplying circuit 1 for supplying a driving voltage to a bit line; a load resistance switching circuit (load resistance regulating circuit 2) for regulating a bit line load resistance depending on the position of a memory cell MC; a write/read circuit 3 for controlling writing of data to a memory cell MC or reading of data from a memory cell MC; a column selecting circuit 4 for selecting the column of a memory cell MC; and a row selecting circuit 5 for selecting the row of a memory cell MC. The memory array 6 comprises a plurality of memory cells MC with respect to which write and read operations are performed by the control circuit.

The memory array 6 comprises: a plurality of first bit lines (sub-bit lines) SBLA (SBLA1 to SBLAn, SBLAn+1, ...) arranged in parallel to one another; a plurality of second bit lines (sub-bit lines) SBLB (SBLB1 to SBLBn, SBLBn+1, ...) each provided on the left side of a corresponding sub-bit line SBLA; a plurality of third bit lines (main-bit lines) MBL ( ..., MBLi, MBLi+1, ...) each connected to a corresponding sub-bit line SBLB; a plurality of word select lines WL (WL0, ..., WLm, ...) arranged in parallel to one another in a direction crossing the sub-bit lines SBLB (e.g., orthogonally); a plurality of memory cells MC ( ..., $MC_{m,1}$ to $MC_{m,n}$, ...) each provided between adjacent sub-bit lines SBLA; a plurality of bit line selecting elements (select transistors) ST ( . . . , STn to STn+1, . . . ) each provided between a main-bit line MBL and a sub-bit line SBLB branched therefrom; and a plurality of sub-bit line selecting line SGT (SGT1 to SGTj, . . . ) each connected to the gate terminals of a corresponding select transistor group.

In the memory array 6, for example, it is assumed that a memory cell positioned on column n selected by the sub-bit lines SBLAn and SBLBn and row m selected by a word line WLm is referred to as $MC_{m,n}$.

The memory cell $MC_{m,n}$ is made of a MOSFET (MOS transistor). The source terminal and the drain terminal thereof are connected to adjacent sub-bit lines SBLAn and SBLAn+1, which are formed on a semiconductor substrate by impurity diffusion. The gate terminal of a memory cell $MC_{m,n}$ is connected to the word select line WLm. Note that a sub-bit line SBLB is shown to overlap a memory cell $MC_{m,n}$ in FIG. 1, but is not connected to the memory cell $MC_{m,n}$.

In addition, the adjacent sub-bit lines SBLAn and SBLAn+1 are connected via respective contacts C provided on the opposite ends thereof to the sub-bit lines SBLBn and SBLBn+1, respectively, which are made of a metal conductor.

The adjacent sub-bit lines SBLBn and SBLBn+1 are connected to one of the source terminal and the drain terminal of the sub-bit line select transistors STn and STn+1, respectively. The other of the source terminal and the drain terminal of each of the select transistors STn and STn+1 is connected to main-bit lines MBLi and MBLi+1. Because of this arrangement, the conductor length from the source terminal of each memory cell $MC_{m,n}$ to the write/read bias supplying circuit 1 is substantially equal to the conductor length from the drain terminal of each memory cell $MC_{m,n}$ to the write/read bias supplying circuit 1.

In addition, the main-bit lines MBLi and MBLi+1 are connected to the column selecting circuit 4. The column selecting circuit 4 is connected to the write/read circuit 3. The load resistance regulating circuit 2 (hereinafter referred to as a load resistance switching circuit 2) is provided between the write/read circuit 3 and the write/read bias supplying circuit 1 for supplying a bit line driving voltage.

The load resistance switching circuit 2 has a plurality of load resistance element 2a arranged in parallel and having-different resistance values, and a multiplexer circuit 2b for selecting at least one of the load resistance elements 2a. The multiplexer circuit 2b receives row address information on a bit line of a selected memory cell MC, and selects a load resistance element 2a based on the received row address information.

Each load resistance element 2a has its major portion which has the same structure as that of at least a portion of a bit line, and is preferably produced in the same production step. In addition, each load resistance element 2a is preferably produced using the same design protocol as that of at least a portion of a bit line.

Hereinafter, a method for regulating a bit line load resistance in the semiconductor memory device 10 of Embodiment 1, which has the above-described configuration, will be described.

For example, the conductor resistance of the drain-side sub-bit line SBLAn+1 of a memory cell $MC_{m,n}$ is represented by:

$$(1/(1/m+1/(s-m))) \times r \quad (1)$$

where r indicates the resistance value of a sub-bit line SBLA per unit cell, and s indicates a gap between each contact C connecting sub-bit lines SBLA and SBLB.

The conductor resistance of the source-side sub-bit line SBLAn of a memory cell $MC_{m,n}$ is similarly calculated.

The total load resistance of the drain-side bit line of a memory cell $MC_{m,n}$ is represented by:

$$\{(1/(1/m+1/(s-m))) \times r + t + u\} \quad (2)$$

where t indicates the ON resistance value of a sub-bit line select transistor ST connected to the memory cell $MC_{m,n}$, and u indicates a conductor resistance value from the column selecting circuit 4 to a main-bit line MBLi connected to the memory cell $MC_{m,n}$.

The total load resistance of the source-side bit line of a memory cell $MC_{m,n}$ is similarly calculated.

Therefore, in the semiconductor memory device 10 of Embodiment 1, the total load resistance of the bit line of a memory cell $MC_{m,n}$ on the bit lines can be represented by a function of m and u which are determined by the address of the memory cell $MC_{m,n}$.

In the load resistance switching circuit 2, a difference in bit line load resistance value (see expression (2)) depending on the position (address) of a memory cell is regulated to be reduced (within a predetermined range) or to be the same, in the following manner. The multiplexer circuit 2b selects a load resistance element 2a based on information about an address along a row direction on a bit line (row address information), and inserts a load resistance between the write/read circuit 3 and the write/read bias supplying circuit 1. The source-side or drain-side total load resistance of a memory cell $MC_{m,n}$ is represented by:

$$\{(1/(1/m+1/(s-m))) \times r + t + u\} + x \quad (3)$$

where x indicates a load resistance value inserted between the write/read circuit 3 and the write/read bias supplying circuit 1.

By changing the load resistance value x to be inserted to the load resistance switching circuit 2, a bit line load resistance within a chip viewed from the write/read bias supplying circuit 1 can be regulated to be constant or within a predetermined range no matter which row address on a bit line is selected, i.e., no matter which memory cell $MC_{m,n}$ is selected.

As described above, according to Embodiment 1, a memory cell $MC_{m,n}$ is connected to the bias supplying circuit 1 via a sub-bit line SBLA made of an impurity diffusion region, a sub-bit line SBLB made of a metal conductor, a bit line select transistor SGT, and a main-bit line MBL. The load resistance switching circuit 2 is provided between the memory array 6 and the bias supplying circuit 1, which regulates a difference in bit line load resistance depending on the position (address) of a memory cell $MC_{m,n}$ so that the difference is reduced (within a predetermined range) or the bit line load resistance is the same. In the load resistance switching circuit 2, the multiplexer 2b selects one of a plurality of load resistance elements 2a based on the row address information of a selected memory cell $MC_{m,n}$ so that the sum of the load resistances between the source terminal or the drain terminal of a memory cell $MC_{m,n}$ and the output terminal of the bias supplying circuit 1 is within a predetermined range. Thereby, it is possible to regulate source-side and drain-side bit lines to reduce or eliminate a difference in bit line load resistance depending on the address of a memory cell $MC_{m,n}$, and reduce or eliminate a variation in the resistance value of a main-bit line depending on the position of a sub-bit line.

In Embodiment 1, the load resistance regulating circuit 2 is described as a load resistance switching circuit 2 having a plurality of load resistance elements 2a and a multiplexer 2b which is a resistance element selecting means for selecting at least one of the load resistance elements 2a. The present invention is not limited to this. The load resistance regulating circuit 2 may be, for example, configured to have a transistor or the like, which is a variable resistance element, and a resistance value controlling means for outputting a control voltage to the gate terminal of the transistor so that the resistance value of the transistor depends on the control voltage. The resistance value controlling means changes the conductive resistance value of the transistor (variable resistance element) depending on the address information (the position of a memory cell MC; e.g., row address information) of a memory element (memory cell MC).

Embodiment 2

Figure 2:
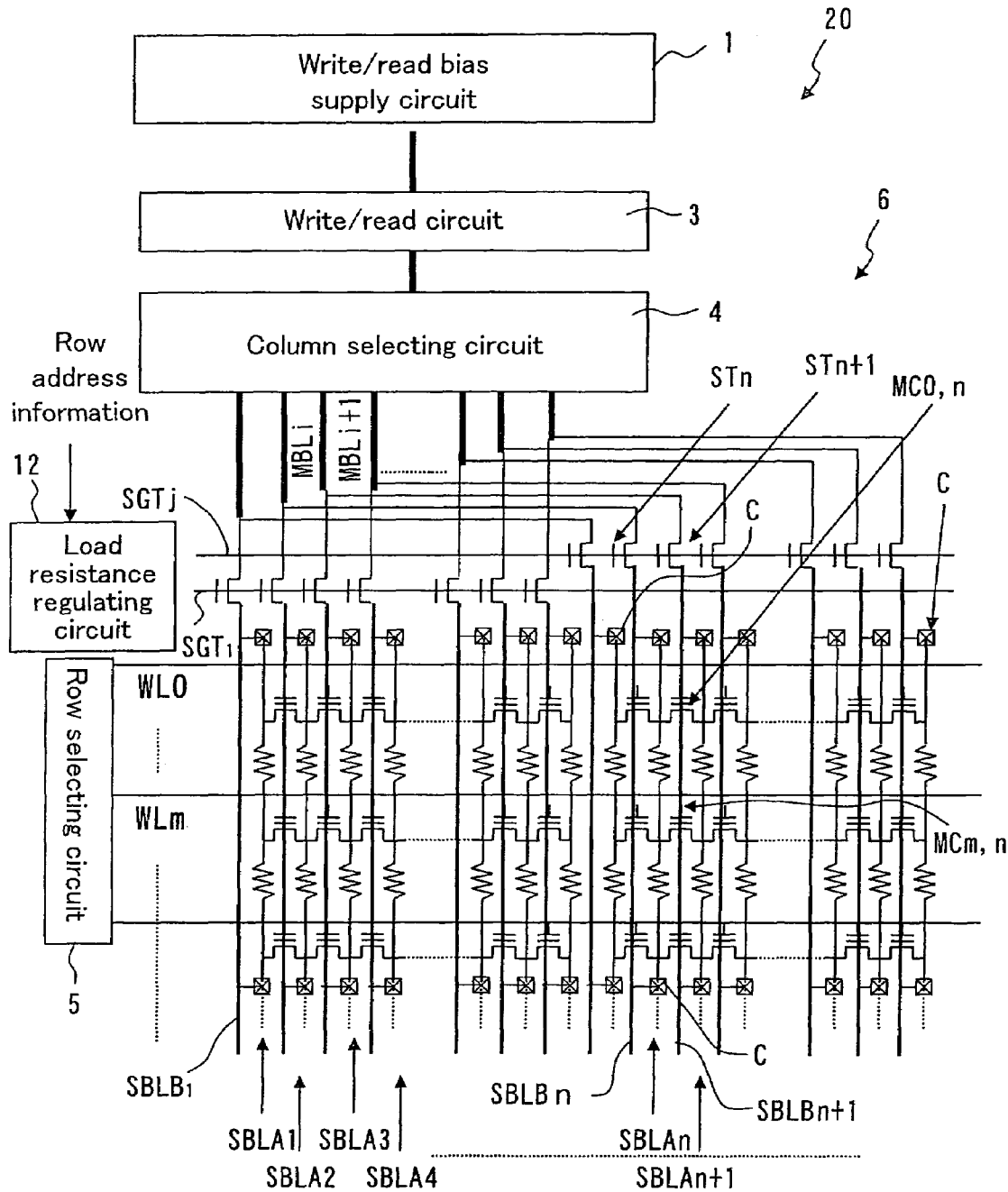
FIG. 2 is a diagram showing an equivalent circuit configuration of a memory array and a control circuit thereof in a semiconductor memory device according to Embodiment 2 of the present invention.
Figure 3:
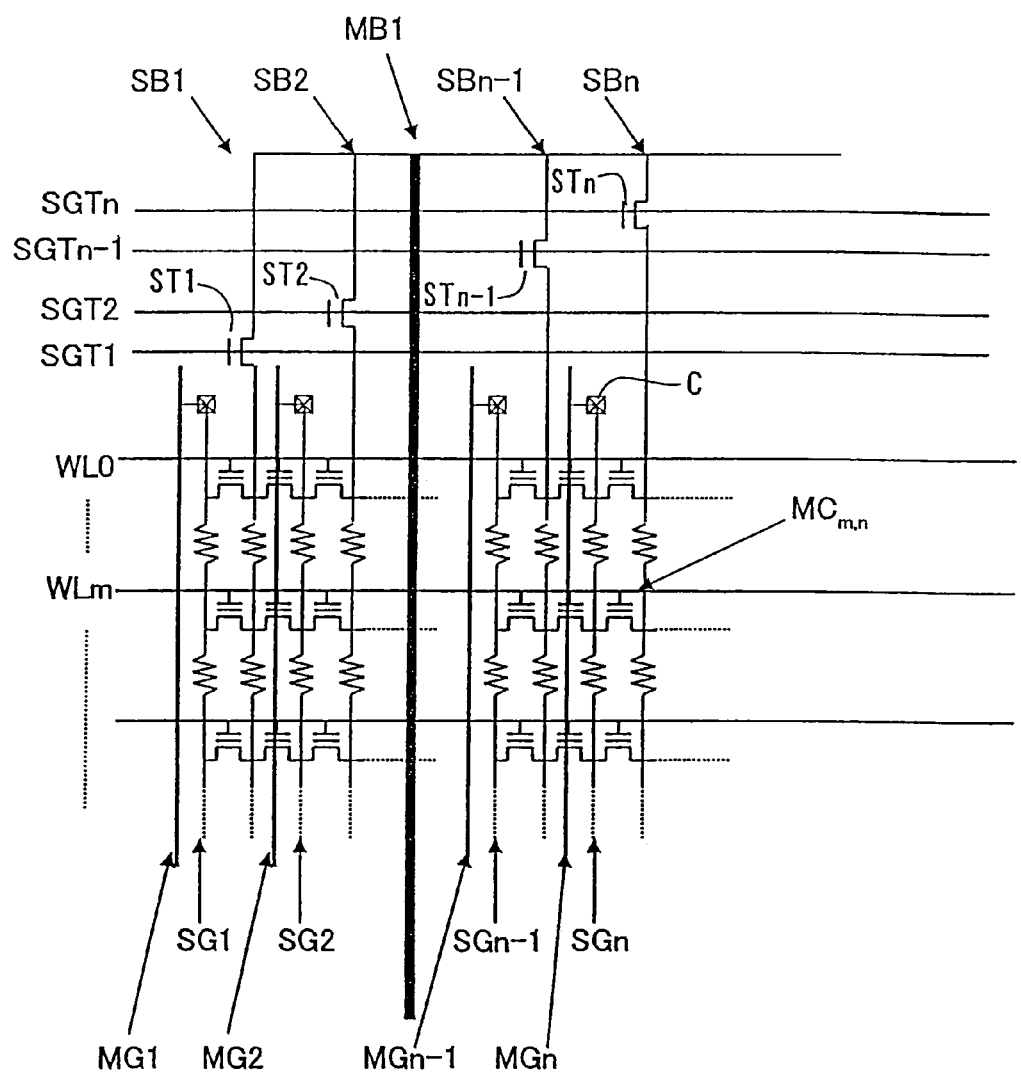
FIG. 3 is an equivalent circuit diagram showing a memory array structure of a conventional semiconductor memory device.

FIG. 2 is a diagram showing an equivalent circuit configuration of a memory array and a control circuit thereof in a semiconductor memory device according to Embodiment 2 of the present invention.

In FIG. 2, a semiconductor memory device 20 has a load resistance regulating circuit 12 for regulating (variable control) the driving ability of a sub-bit line select transistor ST, as a load resistance regulating circuit for reducing or eliminating a difference in bit line load resistance, instead of the load resistance switching circuit 2 (load resistance switching circuit 2) of FIG. 1.

The load resistance regulating circuit 12 receives row address information of a memory cell $MC_{m,n}$, and switches and outputs a plurality of voltages based on the row address information.

The load resistance regulating circuit 12 switches output voltages based on information about an address position on a bit line (row address information) so as to reduce or eliminate a difference in bit line load resistance value depending on the position (address) of a memory cell according to the above-described expression (2). Specifically, a sub-bit line select signal is supplied to a sub-bit line selecting line SGT connected to the gate terminal of a sub-bit line select transistor ST. As a result, the driving ability of the sub-bit line select transistor ST is regulated (controlled), so that the ON resistance value t thereof is regulated (controlled). The source-side or drain-side total load resistance of a memory cell $MC_{m,n}$ is represented by:

$$\{(1/(1/m+1/(s-m)))\times r + t' + u\} \quad (4)$$

where t' indicates the regulated ON resistance value of the bit line select transistor ST.

Therefore, by changing the ON resistance value t' (the driving ability of a sub-bit line select transistor ST), a bit line load resistance within a chip viewed from the write/read bias supplying circuit 1 can be regulated to be constant or within a predetermined range no matter which row address on a bit line is selected, i.e., no matter which memory cell $MC_{m,n}$ is selected.

Note that in Embodiments 1 and 2, two driving terminals (source terminal and drain terminal) of a memory cell MC (memory element) are made of an impurity diffusion region, a contact C with respect to a metal conductor is not provided for each memory cell MC, but a contact C with respect to a metal conductor is provided for a plurality of memory cells MC. Thus, Embodiments 1 and 2 have a contactless structure.

The above-described memory cell MC is a non-volatile memory element which utilizes the above-described channel hot electron injection phenomenon to do memory operations, such as an information read operation, an information write operation, or an information erase operation.

The load resistance regulating circuit 12 sets a resistance value such that the sum of load resistances between a driving terminal of a selected memory element and the output terminal of a voltage supplying circuit for supplying a voltage to a bit line is constant or within a predetermined range, no matter where the selected memory element is located. Alternatively, the conductor length from one of the driving terminals of a memory element to a voltage supplying circuit, for supplying a voltage to a bit line, may be equal to the conductor length from the other driving terminal of the memory element to the voltage supplying circuit, or the difference therebetween may be within a predetermined range.

The term "predetermined range" will be described below. Because of its miniaturization, a sub-bit line has a resistance per unit conductor length higher than that of a main-bit line. When resistance elements are prepared for all word line addresses, the scale of a regulating circuit becomes excessively large. When the resistance of a sub-bit line is dominant for the entire bit line, an auxiliary resistance element for an address for describing a relative position within a sub-bit line is provided to effectively regulate a bit line resistance value using a minimum circuit scale. In this case, it is not possible to cancel a difference in bit line resistance value due to a difference in the position of a sub-bit line on a main-bit line. Therefore, the regulation range of the regulating circuit should be within the maximum difference in bit line resistance value due to a difference in the position of a memory element on a main-bit line. For example, it is assumed that the maximum conductor length of a main-bit line has a resistance value of 500 ohm. In this case, a variation in the total resistance value of a selected bit line due to a difference in the address position of a selected word line is regulated to be within 500 ohm, assuming that the regulating circuit regulates a sub-bit line resistance, which is much greater than the resistance value of 500 ohm.

In general, a variation range in the total resistance value of a selected bit line in all word line addresses is preferably regulated to be equal to or smaller than the difference between the maximum resistance value in the total conductor length of a bit line and 50% of the maximum resistance value.

For example, in the field of semiconductor memory devices, such as non-volatile semiconductor memory devices (e.g., EEPROM, EPROM, etc.) and the like, it is possible to regulate source-side and drain-side bit line load resistances to reduce or eliminate a difference in bit line load resistance depending on the address of a memory cell, and also reduce or eliminate a variation in the resistance value of a main-bit line depending on the position of a sub-bit line.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a plurality of memory elements;
   at least one bit line, wherein a memory operation is performed via at least a portion of the bit line with respect to at least one of the plurality of memory elements; and
   a load resistance regulating circuit for changing a resistance value to reduce or eliminate a difference in bit line load resistance depending on a position of the memory element;
   wherein the load resistance regulating circuit is a load resistance switching circuit having a plurality of resistance elements and a resistance element selecting means for selecting at least one of the plurality of resistance elements,
   the bit line is one of a plurality of bit lines arranged in parallel to one another,
   each of the bit lines comprises a first bit line, a second bit line connected to the first bit line, and a third bit line connected to an end of the second bit line via a bit line selecting element, and the third bit line connected to the load resistance regulating circuit, and
   each of the plurality of memory elements has two driving terminals connected to corresponding first bit lines adjacently located.

2. The semiconductor memory device according to claim 1, further comprising:
   a plurality of word lines,
   wherein the word lines are arranged in parallel to one another, and the bit lines cross the word lines, and
   each of the plurality of memory elements has a control terminal connected to a corresponding word line.

3. The semiconductor memory device according to claim 1, wherein the first bit line is made of an impurity diffusion region, the second bit line is made of a metal conductor, and the third bit line is made of a metal conductor, and
   a voltage is supplied to one of the memory elements via the third bit line, the second bit line, and the first bit line.

4. The semiconductor memory device according to claim 3, wherein the second bit line comprises a plurality of branched lines connected to the third bit line.

5. A semiconductor memory device according to claim 3, wherein the load resistance regulating circuit controls a driving ability of the bit line selecting element to change a resistance value of the bit line selecting element to reduce or eliminate a difference in a load resistance of the bit line.

6. A semiconductor memory device according to claim 5, wherein the load resistance regulating circuit changes and outputs a control voltage of the bit line selecting element based on the address information of the memory element.

7. The semiconductor memory device according to claim 1, wherein the load resistance regulating circuit is provided on a voltage supplying path between an end of the bit line and an output end of a voltage supplying circuit for supplying a predetermined voltage to the bit line.

8. The semiconductor memory device according to claim 1, wherein the load resistance regulating circuit changes a resistance value based on address information to reduce or eliminate a difference in a load resistance of a bit line in a row direction.

9. The semiconductor memory device according to claim 1, wherein the resistance element selecting means switches the resistance elements based on the address information of the memory element.

10. The semiconductor memory device according to claim 1, wherein a major portion of at least one of the plurality of resistance elements has the same structure as that of at least a portion of the bit line and the major portion of the resistance element and the portion of the bit line are produced by the same production step.

11. The semiconductor memory device according to claim 1, wherein a major portion of at least one of the plurality of resistance elements is produced using the same design protocol as that of at least a portion of the bit line.

12. A semiconductor memory device according to claim 1, wherein a first conductor length, from one driving terminal of the memory element to a voltage supplying circuit for supplying a voltage to the bit line, is equal to a second conductor length, from the other driving terminal of the memory element to the voltage supplying circuit, or a difference between the first and second conductor length is within a predetermined range.

13. The semiconductor memory device according to claim 1, wherein the semiconductor memory device has a contactless structure, in which two driving terminals of the memory element are made of an impurity diffusion region, a contact portion with respect to a metal conductor is not provided for each and every memory element, but is provided for a set of the plurality of memory elements.

14. The semiconductor memory device according to claim 1, wherein the memory element is a MOS transistor.

15. The semiconductor memory device according to claim 1, wherein the memory element is configured to utilize a channel hot electron injection phenomenon to do memory operations, such as an information read operation, an information write operation, or an information erase operation.

16. A semiconductor memory device comprising:
   a plurality of memory elements;
   at least one bit line, wherein a memory operation is performed via at least a portion of the bit line with respect to at least one of the plurality of memory elements; and
   a load resistance regulating circuit for changing a resistance value to reduce or eliminate a difference in bit line load resistance depending on a position of the memory element;
   wherein the load resistance regulating circuit has a variable resistance element and a resistance value controller for controlling the variable resistance element to change the resistance value thereof,
   the bit line is one of a plurality of bit lines arranged in parallel to one another,
   each of the bit lines comprises a first bit line, a second bit line connected to the first bit line, and a third bit line connected to an end of the second bit line via a bit line selecting element, and the third bit line connected to the load resistance regulating circuit, and
   each of the plurality of memory elements has two driving terminals connected to corresponding first bit lines adjacently located.

17. The semiconductor memory device according to claim 16, wherein the resistance value controller changes the resistance value of the variable resistance element based on the address information of the memory element.

18. A semiconductor memory device comprising:
   a plurality of memory elements;
   at least one bit line, wherein a memory operation is performed via at least a portion of the bit line with respect to at least one of the plurality of memory elements; and a load resistance regulating circuit for changing a resistance value to reduce or eliminate a difference in bit line load resistance depending on a position of the memory element;

wherein the load resistance regulating circuit determines the resistance value so that a sum of load resistances between a driving terminal of the selected memory element and an output end of a voltage supplying circuit for supplying a voltage to the bit line is constant or within a predetermined range, irrespective of a position of the selected memory elements, the bit line is one of a plurality of bit lines arranged in parallel to one another, each of the bit lines comprises a first bit line, a second bit line connected to the first bit line, and a third bit line connected to an end of the second bit line via a bit line selecting element, and the third bit line connected to the load resistance regulating circuit, and each of the plurality of memory elements has two driving terminals connected to corresponding first bit lines adjacently located.

19. A semiconductor memory device, comprising:

a plurality of memory elements;

at least one bit line, wherein a memory operation is performed via at least a portion of the bit line with respect to at least one of the plurality of memory elements; and a load resistance regulating circuit for changing a resistance value to reduce or eliminate a difference in bit line load resistance depending on a position of the memory element;

wherein the load resistance regulating circuit is a load resistance switching circuit having a plurality of resistance elements and a resistance element selector for selecting at least one of the plurality of resistance elements, the bit line is one of a plurality of bit lines arranged in parallel to one another, each of the bit lines comprises a first bit line, a second bit line connected to the first bit line, and a third bit line connected to an end of the second bit line via a bit line selecting element, and the third bit line connected to the load resistance regulating circuit, and each of the plurality of memory elements has two driving terminals connected to corresponding first bit lines adjacently located.

20. The semiconductor memory device according to claim 19, wherein the first bit line is made of an impurity diffusion region, the second bit line is made of a metal conductor, and the third bit line is made of a metal conductor, and a voltage is supplied to one of the memory elements via the third bit line, the second bit line, and the first bit line.

21. The semiconductor memory device according to claim 19, wherein the load resistance regulating circuit is provided on a voltage supplying path between an end of the bit line and an output end of a voltage supplying circuit for supplying a predetermined voltage to the bit line.

22. The semiconductor memory device according to claim 19, wherein the load resistance regulating circuit changes a resistance value based on address information to reduce or eliminate a difference in a load resistance of a bit line in a row direction.

23. The semiconductor memory device according to claim 19, wherein the resistance element selector switches the resistance elements based on the address information of the memory element.

* * * * *